(12) United States Patent
Tournier et al.

(10) Patent No.: US 7,642,579 B2
(45) Date of Patent: Jan. 5, 2010

(54) IMAGE SENSOR COMPRISING PIXELS WITH ONE TRANSISTOR

(75) Inventors: Arnaud Tournier, Grenoble (FR); François Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 153 days.

(21) Appl. No.: 11/713,903

(22) Filed: Mar. 5, 2007

(65) Prior Publication Data
US 2007/0215909 A1    Sep. 20, 2007

(30) Foreign Application Priority Data
Mar. 6, 2006    (FR) .................................. 06 50765

(51) Int. Cl.
*H01L 31/062* (2006.01)
*H01L 21/00* (2006.01)
(52) U.S. Cl. .............................. 257/292; 257/E27.133; 257/E21.409; 438/57; 438/197
(58) Field of Classification Search ................. 257/291, 257/292, E27.133, E21.409; 438/57, 197
See application file for complete search history.

(56) References Cited

U.S. PATENT DOCUMENTS

| | | | |
|---|---|---|---|
| 6,656,777 B2 * | 12/2003 | Miida | 438/154 |
| 7,195,976 B2 * | 3/2007 | Adachi et al. | 438/258 |
| 7,304,338 B2 * | 12/2007 | Hiroshi | 257/292 |
| 2002/0024071 A1 | 2/2002 | Kawajiri et al. | |
| 2005/0224844 A1 | 10/2005 | Mizuguchi | |

OTHER PUBLICATIONS

French Search Report from French Patent Application 06/50765, filed Mar. 6, 2006.
Patent Abstracts of Japan vol. 2003, No. 12, Dec. 5, 2003 & JP 2004 187017 A (Innotech Corp.), Jul. 2, 2004.

* cited by examiner

*Primary Examiner*—Tuan N. Quach
(74) *Attorney, Agent, or Firm*—Lisa K. Jorgenson; William R. McClellan; Wolf, Greenfield & Sacks, P.C.

(57) ABSTRACT

A pixel having a MOS-type transistor formed in and above a semiconductor substrate of a first doping type, a buried semiconductor layer of a second doping type being placed in the substrate under the MOS transistor and separated therefrom by a substrate portion forming a well. The buried semiconductor layer comprises a thin portion forming a pinch area placed under the transistor channel area and a thick portion placed under all or part of the source/drain areas of the transistor.

18 Claims, 4 Drawing Sheets

IMAGE SENSOR COMPRISING PIXELS WITH ONE TRANSISTOR

BACKGROUND OF THE INVENTION

1. Field of the Invention

The present invention relates to image sensor pixels, and more specifically to pixels comprising elements formed in a semiconductor substrate such as a silicon wafer.

2. Discussion of the Related Art

An example of a pixel formed at the surface of a semiconductor substrate is described in U.S. Pat. No. 6,448,596. The pixel comprises a photodiode and an N-channel MOS transistor (NMOS). As illustrated in FIG. 4A of this patent, reproduced in FIG. 1 of the present application, the transistor comprises a ring-shaped gate 59, an N-type source area 56 formed at the substrate surface, inside of the gate, and an N-type drain area 57a formed around the gate. The photodiode is formed of an extension 57 of the transistor drain area, of a well area 54a placed under extension 57, and of a buried layer 52a placed under this well area.

Incident photons arriving through an opening 63 of a reflective metal layer 62 placed above the pixel generate electron-hole pairs at the level of well area 54a. The holes thus formed are collected under the gate of the NMOS transistor in heavily-doped P-type pockets 55. In a read phase, the modifications of the electric conduction characteristics of the transistor are determined according to the quantity of holes stored under the gate. The holes accumulated under the gate are regularly "evacuated" by application of high voltages on the gate and on the transistor source/drain areas.

Such a pixel takes up a significant substrate surface area, especially due to the presence of the photodiode. Further, the pixels are insulated from one another by N-doped semiconductor areas 53 surrounding the pixels, which areas also increase the sensor surface area.

SUMMARY OF THE INVENTION

An embodiment of the present invention provides a pixel comprising a MOS-type transistor formed in and above a semiconductor substrate of a first doping type, a buried semiconductor layer of a second doping type being placed in the substrate under the MOS transistor and separated therefrom by a substrate portion forming a well, in which the buried semiconductor layer comprises a thin portion forming a pinch area placed substantially under the transistor channel area and a thick portion placed under all or part of the source/drain areas of the transistor.

According to an embodiment of the above-mentioned pixel, said pinch area is placed in the upper portion of the buried semiconductor layer, close to the substrate surface.

According to an embodiment of the above-mentioned pixel, an insulating area placed in the upper portion of the substrate surrounds the source/drain areas and the channel area of the transistor, said thick portion of the semiconductor layer surrounding the pinch area and extending under the insulating area.

According to an embodiment of the above-mentioned pixel, a tank area of the same doping type as the semiconductor substrate, but more heavily-doped than said substrate is placed at the level of the channel area, at the substrate surface.

According to an embodiment of the above-mentioned pixel, the transistor comprises an insulated gate placed above the semiconductor substrate, the source/drain areas being placed on either side of the gate in the upper portion of the substrate, the surface portion of the substrate located between the source/drain areas under the gate forming said channel area.

According to an embodiment of the above-mentioned pixel, the gate and the source/drain areas of the transistor as well as the buried semiconductor layer are connected to conductive lines placed above the substrate, said well being floating.

An image sensor according to an embodiment of the invention comprises pixels such as those mentioned hereabove, in which the buried semiconductor layers of the pixels form one and the same buried semiconductor layer.

According to an another embodiment of the above-mentioned sensor, said insulating areas of the pixels separate the pixel transistors from one another, the depth of the insulating areas being smaller than that of the pixel wells.

According to an another embodiment of the above-mentioned sensor, the wells of a pixel assembly extend under the insulating areas surrounding the transistors of these pixels, the wells of this pixel assembly being adjacent to one another.

According to another embodiment of the present invention provides a method for forming a pixel is provided, comprising forming, in a semiconductor substrate of a first doping type, an insulating area surrounding an upper portion of the substrate called active area; forming, in the semiconductor substrate, a buried semiconductor layer of a second doping type; forming a deep buried semiconductor pocket of the first doping type by ion implantation in a lower portion of the buried layer, whereby the thickness of the buried layer is decreased above this buried pocket, the buried pocket being placed substantially above a central strip of the active area intended to form a channel area; forming an insulated gate above the central strip of the active area; forming source/drain areas of the second doping type in the active area, on either side of the gate.

The foregoing and other objects, features, and advantages of the present invention will be discussed in detail in the following non-limiting description of specific embodiments in connection with the accompanying drawings.

DETAILED DESCRIPTION

Figure 1:
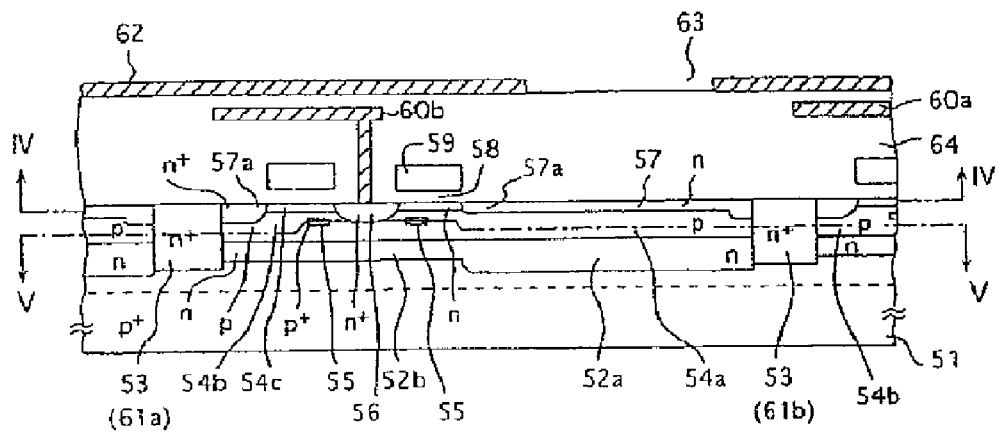
FIG. 1 is a previously-described diagram of a known pixel.

For clarity, the same elements have been designated with the same reference numerals in the different drawings and, further, as usual in the representation of integrated circuits, the drawings are not to scale.

A pixel according to an embodiment of the present invention comprises a MOS transistor formed in and above a semiconductor substrate. A buried semiconductor layer of a doping type opposite to that of the substrate is placed in the substrate under the transistor. The buried layer comprises a thin portion forming a pinch area placed under the transistor channel area.

The structure and the operation of such a pixel are described in further detail hereafter based on an example of an image sensor comprising pixels according to embodiments of the present invention.

Figure 2:
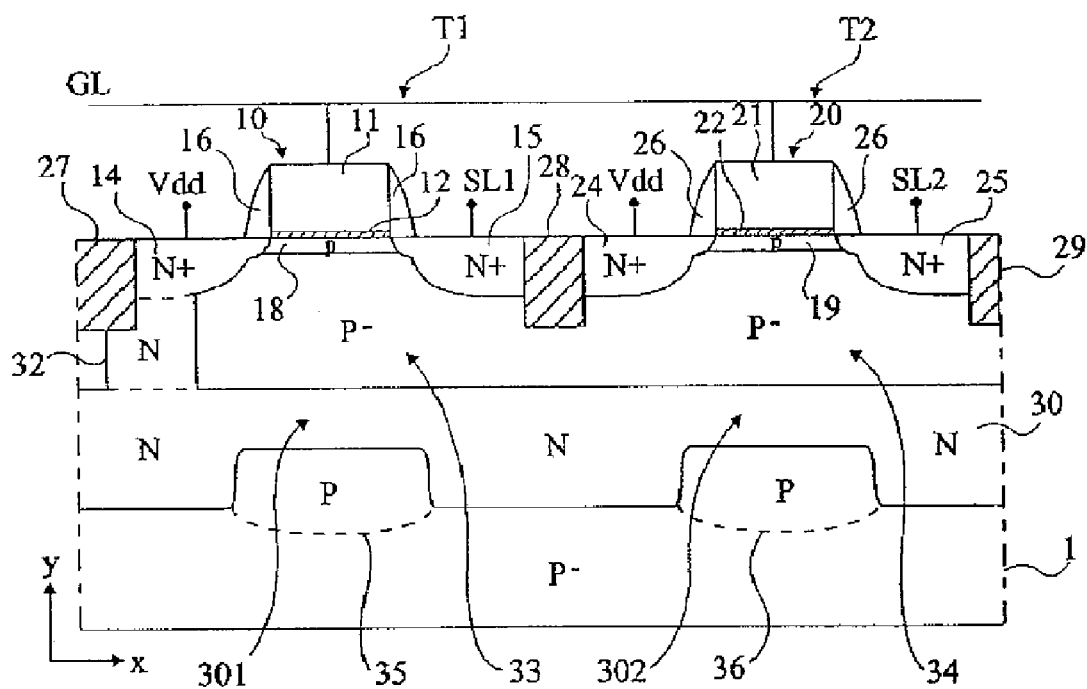
FIG. 2 is a cross-section view of a portion of a sensor according to an embodiment of the present invention.

FIG. 2 is a cross-section view of an example of an image sensor comprising two pixels. The sensor is formed in a semiconductor substrate 1, lightly P-type doped in this example. Each pixel comprises an NMOS transistor T1, T2. Each transistor comprises a gate 10, 20 formed of a conductive portion 11, 21 placed on the substrate and insulated therefrom by an insulating portion 12, 22. Each transistor further comprises a heavily-doped N-type drain area 14, 24 and source area 15, 25 formed at the substrate surface on either side of gate 10, 20. Insulating spacers 16, 26 are formed against the sides of gates 10, 20. It should be noted that source area 15, 25 and drain area 14, 24 comprise in this example thin lightly-doped N-type extensions placed under insulating spacers 16 and 26. Further, the surface portion of the substrate placed between the source and drain areas of each transistor T1, T2, under its gate, forms a channel area.

The sensor pixels and more specifically transistors T1, T2 are insulated from one another by shallow insulating areas. Portions 27, 28, 29 of these insulating areas are shown in FIG. 2, respectively to the left of drain area 14 of transistor T1, between source area 15 of transistor T1 and drain area 24 of transistor T2, and to the right of source area 25 of transistor T2.

An N-type doped buried semiconductor layer 30 is placed in P substrate 1 under transistors T1, T2. An N-type doped access area 32 is placed in substrate 1 between drain area 14 and buried layer 30 to enable electric biasing thereof. The substrate portions placed between transistors T1, T2 and N buried layer 30 form wells 33 and 34. Wells 33 and 34 are adjacent to each other under insulating area 28 separating transistors T1, T2 of the two shown pixels.

According to an embodiment, the buried layer 30 is thinner under the channel areas of transistors T1, T2 of the sensor pixels. Thinner portions of buried layer 30 form "pinch" areas 301 and 302. Pinch areas 301 and 302 are preferably located at the top of buried layer 30 as close as possible to transistors T1 and T2. The function of the pinch areas is described in further detail in the following description.

In the image sensor example shown in FIG. 2, substrate portions 35, 36 located at the level of the recesses of buried layer 30, under pinch areas 301 and 302, are slightly more heavily doped than substrate 1.

P-type "tank" areas 18 and 19, more heavily-doped than substrate 1, are formed at the surface of substrate 1 under gates 10 and 20 at the level of the transistor channel areas. The thickness of tank areas 18 and 19 is substantially identical to that of the lightly-doped extensions of the source/drain areas of transistors T1, T2.

Transistors T1, T2 of each of the pixels are connected to conductive lines placed above substrate 1 in one or several insulating layers covering the substrate and the gates of transistors T1, T2. Conductive portions 11, 21 of gates 10, 20 are connected to a gate line GL. Source areas 15 and 25 are respectively connected to source lines SL1 and SL2. Drain areas 14 and 24 are connected to a supply voltage Vdd.

It should be noted that buried layer 30 is biased, in the example shown in FIG. 2, via access area 32 and drain area 14 connected to supply voltage Vdd. Wells 33 and 34 are, as for them, "floating", that is, not directly biased by a voltage source. Wells 33 and 34 are biased by various capacitive couplings with N buried layer 30 and the elements of transistors T1 and T2.

Figure 3:
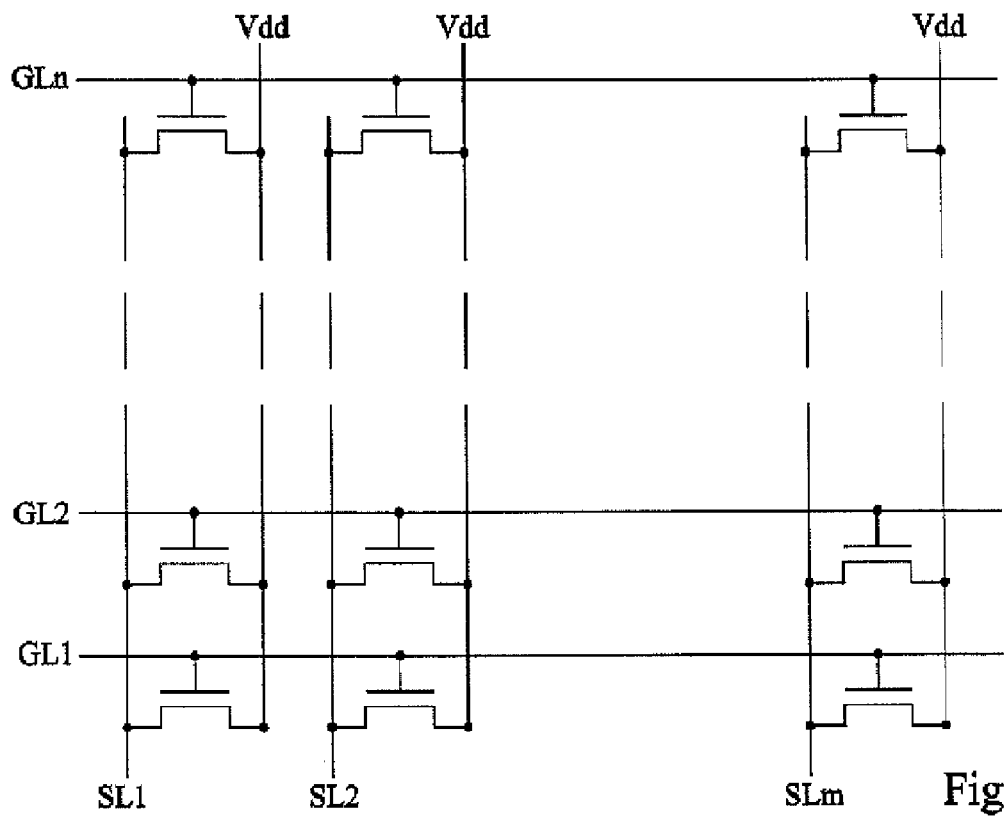
FIG. 3 is an electric diagram of a pixel array of an example of a sensor according to an embodiment of the present invention.

FIG. 3 is a diagram illustrating an example of an image sensor comprising a pixel assembly organized in the form of an array formed of n rows and of m columns of pixels. Only the transistors of each pixel are shown. The gates of the transistors of the pixels of the i-th row, with i ranging between 1 and n, are connected to a gate line GLi. The source area of the transistors of the pixels of the j-th column, with j ranging between 1 and m, are connected to a source line SLj. The drain areas of the transistors are connected to voltage Vdd. Gate lines GL1 to GLn are connected to a control circuit. Source lines SL1 to SLm are connected to a read circuit.

The operation of the above-described image sensor depends on its use, according, for example, to whether it is used as a video camera or as a camera. However, whatever its use, each sensor pixel performs a sequence of operations of three types: integration, reading, and reset. These operations are described hereafter for the sensor pixel shown to the right of FIG. 2 and comprising transistor T2.

In an integration operation, the pixel "captures" incident photons arriving in the upper portion of substrate 1 at the level of well 34. Gate line GL is then biased to a low voltage, for example, the ground. Source line SL2 connected to source area 25 is in high impedance or biased to a voltage at least equal to the voltage of well 34 so that the PN diode formed by P well 34 and source area 25 is not conductive. When a photon is "captured", it generates an electron-hole pair in well 34 or in one of the space charge areas formed at the interfaces between P well 34 and N buried layer 30 or N source/drain areas 24, 25. The holes of the electron-hole pairs thus formed "naturally" direct towards the lowest voltage source, that is, towards the P tank area 19 located under gate 20. The electrons direct towards N buried layer 30 or source/drain areas 24 and 25. As a summary, during this integration operation, holes are accumulated in tank area 19.

It should be noted that the photon capture at the level of the pixel wells is only possible if the photons can access to these wells. The insulating layer(s) covering the substrate need to be transparent. Further, the source/drain areas and the gates of the transistors forming the pixels should not be silicided, as is frequent. Further, the gate material is preferably selected to be as little "absorbing" as possible, or in other words as transparent as possible, so that photons arriving at the level of a gate can cross the latter to reach the substrate. An example of a particularly transparent gate material is zinc-doped indium oxide (ITO).

In a read phase, gate line GL is biased to a voltage Vm enabling turning on transistor T2. Voltage Vm is for example equal to 2 V in the case where supply voltage Vdd of the sensor is 3.6 V. The read circuit connected to source line SL2 comprises for example a current source "setting" a current through line SL2 and accordingly through transistor T2. The voltage of source area 25 then is a function of the quantity of holes stored in reservoir area 19 of the transistor. The greater the number of stored holes, the higher the voltage of the source area, and accordingly that of source line SL2. The read circuit comprises an evaluation device, such as an analog-to-digital converter, which defines a light intensity value received by the pixel according to the voltage value sampled from source line SL2.

In a reset phase, gate line GL and source line SL2 are biased to supply voltage Vdd. The holes stored in tank area 19 then direct towards substrate 1, through pinch area 302. Tank area 19 empties.

Figure 4:
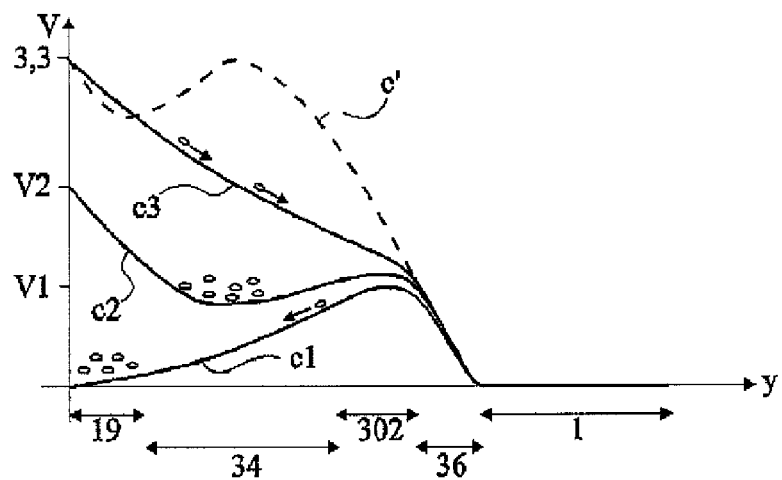
FIG. 4 is a diagram indicating the voltage variations in a pixel of the sensor shown in FIG. 2, between the surface and an internal portion of the substrate.

FIG. 4 is a diagram indicating the voltage variations through the sensor pixel shown to the right of FIG. 2 between tank area 19 and P substrate portion 36 located under pinch area 302. Three voltage curves c1, c2, and c3 are shown for each of the following operations: integration, reading, and reset.

Further, a curve in dotted lines c' shows the voltage variations through this same pixel, above source area 24, by running through a "thick" portion of N buried layer 30. Curve c' is substantially identical whatever the performed operation.

It should be noted that the voltage of pinch area 302 varies little and that it is always much lower than the internal voltage of a thick portion of N buried layer 30. This voltage difference is due to the fact that pinch area 302 is entirely depleted, conversely to a thick portion of N buried layer 30. As an indication, when substrate 1 is grounded and N buried layer 30 is connected to a voltage Vdd on the order of 3.3 V, the voltage value of pinch area 302 is on the order of 1 V. The latter slightly fluctuates according to the performed operations.

In an integration operation (curve c1), the voltage in tank area 19, close to gate 20, is substantially zero. The voltage then progressively increases through tank area 19 and well 34 to reach a maximum value V1 in the middle of pinch area 302. The voltage then progressively decreases through P substrate portion 36, between pinch 302 and substrate 1.

It should be noted that the voltage of the upper P areas, that is, of tank area 19 and of well 34, varies as holes are being stored. The voltage of these P areas progressively increases along with the arrival of holes. In the case where a pixel receives many light photons, it is possible for the voltage of these upper P areas to reach voltage value V1 of pinch area 302. In this case, "excess" holes in the upper P areas naturally direct towards substrate 1 by passing through pinch area 302. The number of stored holes is thus limited and the voltage of the upper P areas does not exceed value V1 during an integration operation.

Generally, the presence of a pinch area in each pixel enables "limiting" the voltage of the tank area and of the well of this pixel to a voltage value substantially corresponding to voltage V1 of the pinch area. This feature enables avoiding "blooming" phenomena, consisting of a disturbance of a pixel row read operation due to an operation of simultaneous integration by other strongly-lit pixels. In practice, if the voltage of the P well of a pixel in integration phase can increase up to a voltage value greater than the voltage value present on the source line SL connected to this pixel, then the PN diode formed by the P well and the source area of this pixel can become conductive and disturb the ongoing read operation. To avoid blooming phenomena in a sensor comprising pixels of the type disclosed, it is enough to provide a read circuit such that the voltage of each source line cannot fall below voltage value V1. Voltage V1 being much lower than supply voltage Vdd of the sensor, those skilled in the art can easily form such a read circuit.

In an integration operation (curve c2), the voltage in tank area 19, close to gate 20, is equal to a value V2 greater than V1. Voltage V2 is in this example equal to 2 V. The voltage then decreases rapidly along with the distance from gate 20 to reach a minimum in well 34, on the order of 0.8 V in this example. The voltage then progressively increases up to pinch area 302, then decreases back as it is moved towards substrate 1. It should be noted that the stored holes are no longer confined close to the gate, but "accumulate" in well 34.

In a reset operation (curve c3), the voltage in tank area 19, close to gate 20, is substantially equal to supply voltage Vdd, that is, 3.3 V in this example. The voltage then progressively decreases as it is moved away from the gate. Accordingly, the holes previously stored in tank area 19 direct towards substrate 1.

It should be noted that the presence of a voltage drop in the N buried layer at the level of pinch area 302 enables easing the hole evacuation. Indeed, if there was no pinch area 302 under tank area 19, the evacuation of the holes through N buried layer 30 would require application of very high voltages on gate 20 and source and drain areas 25 and 24.

In a pixel according to embodiments of the present invention, low voltages, equal to the "standard" supply voltage of the sensor, can be used to evacuate holes accumulated under the pixel transistor gate.

Figure 5:
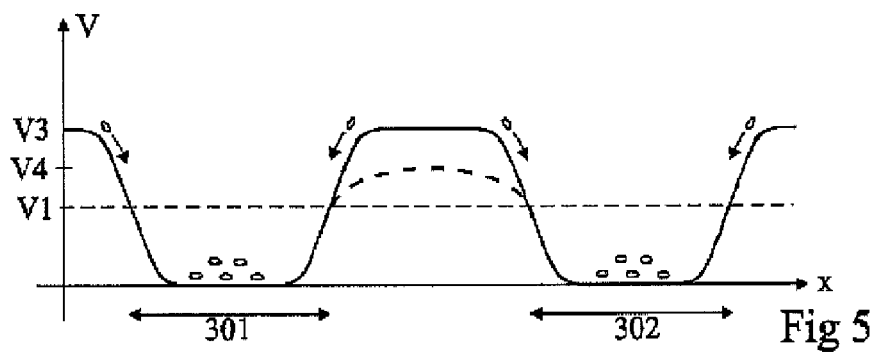
FIG. 5 is a diagram indicating the voltage variations through the wells of the pixels of the sensor shown in FIG. 2.

FIG. 5 is a diagram indicating the voltage variations through wells 33, 34 of the pixels of the sensor shown in FIG. 2. The shown voltage curve corresponds to the voltages sampled from the lower portions of wells 33, 34, located under the level of inter-pixel insulation areas 27, 28, and 29. The shown curve corresponds to the voltages sampled in an integration operation, source areas 15 and 25 being connected to supply voltage Vdd. The voltage in the portions of wells 33, 34 located above pinch areas 301 and 302 is low and close to 0 V in this example. The voltage in the portions of wells 33, 34 located above the thick portions of N buried layer 30 is "high" and equal to V3, on the order of 2 V in this example. The voltage "rises" at the peripheral level of wells 33, 34 under inter-pixel insulation areas 27, 28, 29 enable insulation between the storage areas of holes of neighboring pixels. Thus, a hole generated in a well of a pixel under one of its drain or source areas "naturally" directs towards the inside of this well, then towards the tank area located under the gate of this pixel. It is thus not necessary to provide very deep inter-pixel areas 27, 28, 29.

An advantage of a sensor according to embodiments of the present invention is that the sensor pixel transistors can be separated from one another by shallow insulation areas. In the case where the sensor belongs to an integrated circuit comprising various blocks performing various functions, the insulation areas separating the sensor pixels may be identical to the "conventional" insulation areas separating "standard" transistors from the other integrated circuit blocks.

Generally, the voltage of the lower portions of wells 33, 34 is set as a majority by the capacitive couplings between these wells and N buried layer 30. Thus, the voltage curve in the lower portions of the wells has a shape substantially identical to the curve of the voltages through N buried layer 30.

It should however be noted that the voltage in the lower portion of a well further depends on the voltages applied on the elements of the transistor placed above. Thus, in a read operation, the voltage of a source area can decrease from voltage Vdd to a lower voltage and cause a slight voltage decrease in the peripheral well portion located under this source area. In the case where two source areas of two neighboring transistors are located in the vicinity, it is possible, in a read operation, for the voltage in the peripheral areas of the wells of these pixels to decrease, to pass from a voltage value V3 to a voltage value V4. If voltage value V4 is lower than voltage value V1, the holes stored in a pixel can migrate towards the neighboring pixel. To avoid such migrations, either the capacitive influence of the source areas needs to be restricted by avoiding, for example, excessive large voltage drops on the source lines, or a more significant insulation between two areas of the close sources needs to be provided, for example, by means of deep N-type areas extending from the substrate surface to N buried layer 30 and connected to voltage Vdd.

As described hereabove, the pinch areas enable avoiding blooming phenomena in read operations, using low voltages in reset operations, and insulating neighboring pixels. The surface of a pinch area 301, 302 in top view is substantially identical to that of the channel area of the transistor placed above. However, this pinch surface area may be smaller or conversely, greater. Generally, the surface of a pinch area must be wide enough for the capacitive influence of the pinch area on the above-placed well to be significant and must not extend too much under the source/drain areas of the transistor placed above so that an inter-pixel insulation is possible at the pixel well periphery.

An image sensor such as that shown in FIG. 2 can be obtained for the method described hereafter in relation with FIGS. 6A to 6D. It should be understood that various doped regions are illustrated such as they appear after anneal steps which will not be described.

Figure 6A:
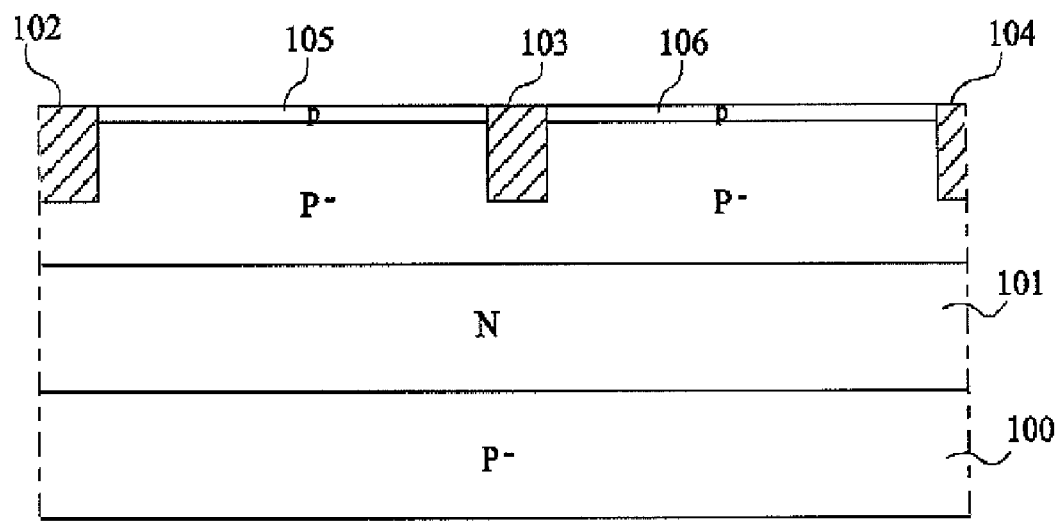
FIGS. 6A, 6B, 6C, and 6D are cross-section views of structures obtained after successive steps of a method for manufacturing an image sensor comprising pixels according to an embodiment of the present invention.

In an initial step, illustrated in FIG. 6A, insulating areas 102, 103, 104 are formed in the upper portion of a lightly-doped substrate 100, for example, of type P. In top view, the insulating areas delimit upper substrate portions forming active areas of future transistors. An ion implantation of dopant elements in the substrate is then performed to form an N-type doped buried layer 101. An ion implantation of dopant elements is further performed at the surface of the active areas to form thin lightly-doped P-type layers 105, 106.

Figure 6B:
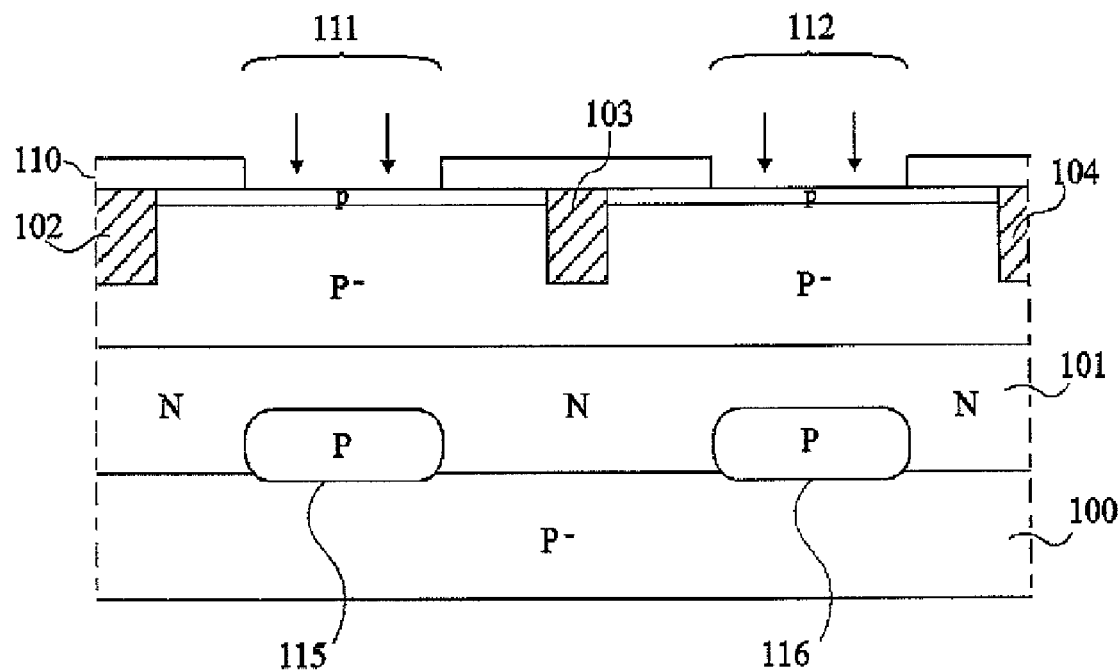

In a next step, illustrated in FIG. 6B, a resist layer 110 is deposited on substrate 100. This resist is insolated and developed to form openings 111, 112 therein above central strips of the active areas intended to form channel areas. An ion implantation of dopant elements at high energy is then performed to form P-type doped buried pockets 115, 116 in the lower portion of N buried layer 101, under openings 111 and 112. Resist layer 110 is then eliminated.

Figure 6C:
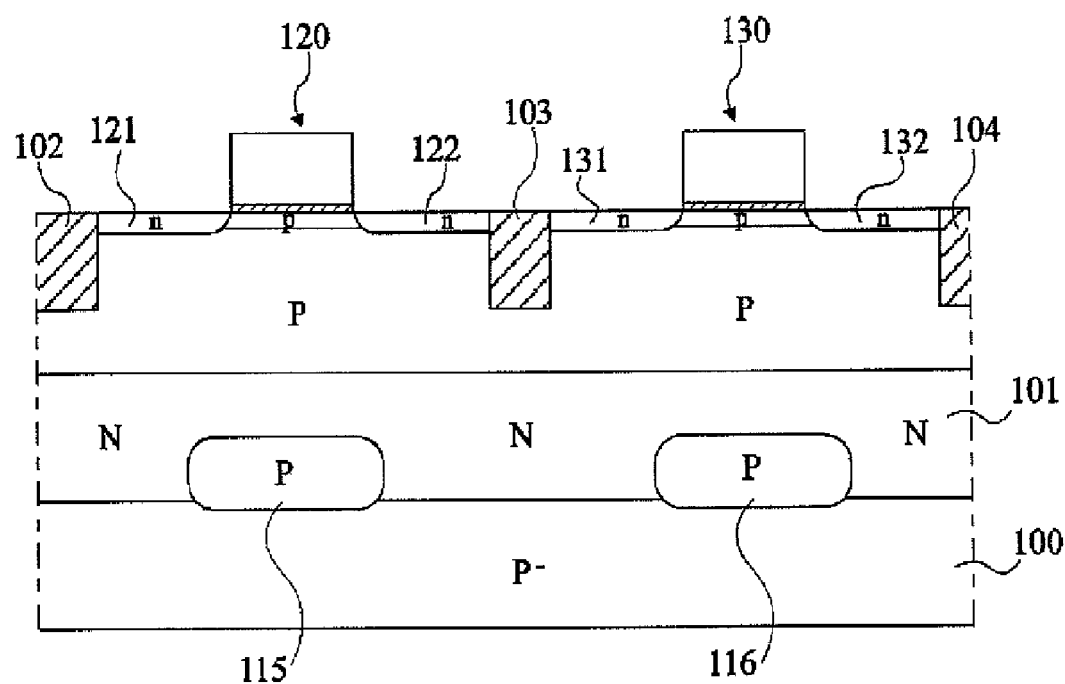

At a next step, illustrated in FIG. 6C, a thin dielectric layer, formed, for example, of silicon oxide, followed by a conductive layer, for example, made of polysilicon, are deposited on substrate 100. The two layers are then etched to form transistor gates 120, 130, each formed of a stacking of an insulating portion and of a conductive portion. An ion implantation of dopant elements is then performed to form lightly-doped N-type pre-source areas 121, 131 and pre-drain areas 122, 132 at the substrate surface, on either side of gates 120, 130.

Figure 6D:
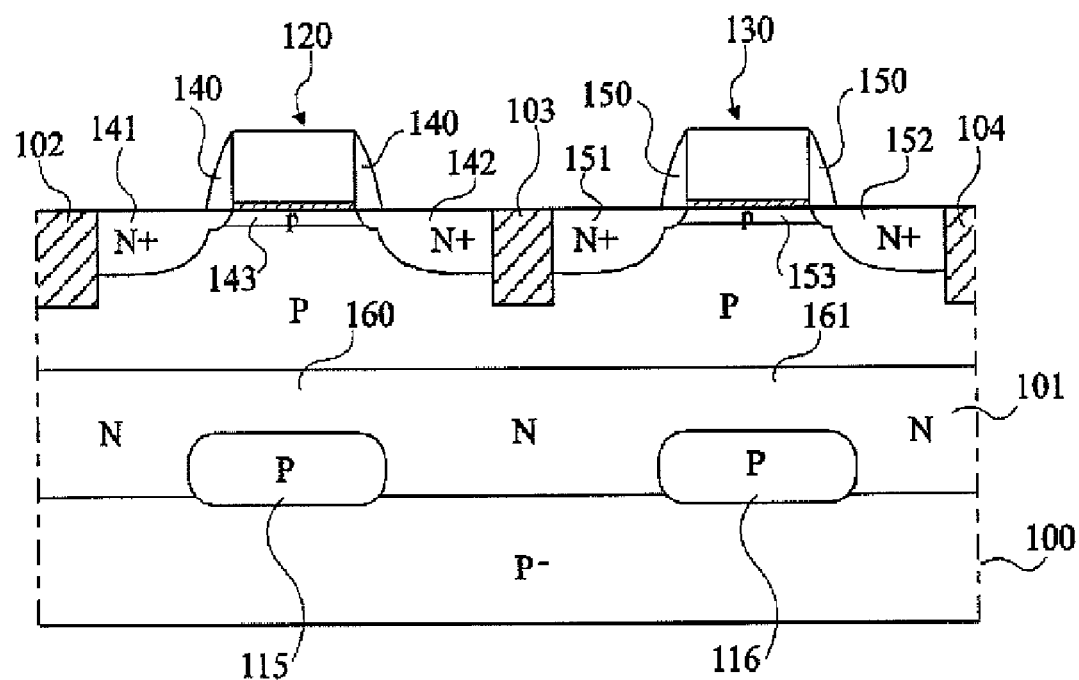

At a next step, illustrated in FIG. 6D, insulating spacers 140, 150 are formed against the sides of gates 120, 130. An ion implantation of dopant elements is then performed in the upper substrate portion to form N-type doped source and drain areas, respectively 141, 151 and 142, 152. The remaining portions of P layers 105, 106 placed under gates 120, 130 form tank areas 143, 153. The portions of N buried layer 101 placed above buried pockets 115, 116 form pinch areas 160, 161.

According to a variation of the above-mentioned method, prior to the forming of P buried pockets 115, 116, a very thin N-type doped layer is formed at the substrate surface so that in the end, thin N areas are placed between gates 120, 130 and P tank areas 143, 153. Such thin N areas ease the hole evacuation in reset operations.

Further, although not shown in FIGS. 6A to 6D, N-type access areas, such as access area 32 of the sensor shown in FIG. 2, can be formed by ion implantation of dopant elements in substrate 100. This implantation may be performed after forming of buried layer 101.

Further, it should be noted that openings 111, 112 and accordingly P buried pockets 115, 116 may be provided to be wider or conversely smaller than P tank areas 143, 153 placed under gates 120 and 130.

As an indication, and non-limitingly, the concentrations in dopant elements, in atoms/cm$^3$, in the different portions of the sensor shown in FIG. 6D are the following:

P substrate 100: $10^{17}$;
P buried pockets 115, 116: $3.10^{17}$;
N buried layer 101: $2.10^{17}$;
tank pockets 143, 153: $2.10^{17}$;
source and drain areas 141/142/151/152: $10^{20}$.

Further, still as a non-limiting indication, the dimensions of the different portions of the sensor shown in FIG. 6D are the following:

thickness of N buried layer 101: 1 µm;
depth of the wells (distance between the substrate surface and N buried layer 101): 1 µm;
thickness of pinch areas 160, 161: 0.5 µm;
depth of source/drain areas 141, 142, 151, 152: 0.3 µm;
depth of insulating areas 102-104: 0.5 µm;
thickness of tank areas 143, 153: 0.1 µm.

It should be noted that the above-mentioned dimensions are approximate since the concentration variations between two different doping areas are progressive.

Of course, the present invention is likely to have various alterations, modifications and improvements which will readily occur to those skilled in the art. In particular, pixels having semiconductor elements with dopings opposite to those of the pixels shown in FIG. 2 may be formed. Such a pixel would comprise a P-channel transistor (PMOS) formed in and above an N-type substrate comprising a P-type buried layer, P-type tank areas being formed under the transistor gates.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A pixel comprising a MOS transistor formed in and above a semiconductor substrate of a first conductivity type, a buried semiconductor layer of a second conductivity type being placed in the substrate under the MOS transistor and separated therefrom by a substrate portion forming a well, wherein the buried semiconductor layer comprises a thin portion forming a pinch area placed substantially under a transistor channel area and a thick portion placed under all or part of source and drain areas of the transistor, the thin portion of the buried semiconductor layer being thinner than the thick portion.

2. The pixel of claim 1, wherein said pinch area is placed in the upper portion of the buried semiconductor layer, close to the substrate surface.

3. The pixel of claim 1, wherein an insulating area placed in an upper portion of the substrate surrounds the source and drain areas and the channel area of the transistor, said thick portion of the buried semiconductor layer surrounding the pinch area and extending under the insulating area.

4. The pixel of claim 1, wherein a tank area of the first conductivity type, but more heavily-doped than said substrate, is placed at a level of the channel area, at the substrate surface.

5. The pixel of claim 1, wherein the transistor comprises an insulated gate placed above the semiconductor substrate, the source and drain areas being placed on either side of the gate in an upper portion of the substrate, a surface portion of the substrate located between the source and drain areas under the gate forming said channel area.

6. The pixel of claim 5, wherein the gate and the source and drain areas of the transistor as well as the buried semiconductor layer are connected to conductive lines placed above the substrate, said well being floating.

7. An image sensor comprising multiple pixels, each of said pixels including an MOS transistor formed in and above a semiconductor substrate of a first conductivity type, a buried semiconductor layer of a second conductivity type being placed in the substrate under the MOS transistor and separated therefrom by a substrate portion forming a well, wherein the buried semiconductor layer comprises a thin portion forming a pinch area placed substantially under a transistor channel area and a thick portion placed under all or part of source and drain areas of the transistor, the thin portion of the buried semiconductor layer being thinner than the thick portion, wherein the pixels have a common buried semiconductor layer.

8. The image sensor of claim 7, wherein an insulating area placed in an upper portion of the substrate surrounds the source and drain areas and the channel area of the transistor, said thick portion of the buried semiconductor layer surrounding the pinch area and extending under the insulating area, and wherein said insulating areas of the pixels separate the transistors of the pixels from one another, the depth of the insulating areas being smaller than that of the wells of the pixels.

9. The image sensor of claim 8, wherein the wells of the pixels extend under the insulating areas surrounding the transistors of the pixels, the wells being adjacent to one another.

10. A method for forming a pixel, comprising:
forming, in a semiconductor substrate of a first conductivity type, an insulating area surrounding an upper portion of the substrate called an active area;
forming, in the semiconductor substrate, a buried semiconductor layer of a second conductivity type;
forming a deep buried semiconductor pocket of the first conductivity type by ion implantation in a lower portion of the buried layer, whereby the thickness of the buried layer is decreased above this buried pocket, the buried pocket being placed substantially below a central strip of the active area intended to form a channel area;
forming an insulated gate above the central strip of the active area; and
forming source and drain areas of the second conductivity type in the active area, on either side of the gate, the buried layer including a thin portion under the channel area and a thick portion under all or part of the source and drain areas the thin portion of the buried layer being thinner than the thick portion.

11. An image sensor pixel comprising:
an MOS transistor formed in a semiconductor substrate of a first conductivity type, the MOS transistor including source and drain areas, a channel area and an insulated gate; and
a buried semiconductor layer of a second conductivity type in the substrate under the MOS transistor and separated therefrom by a substrate portion forming a well, wherein the buried semiconductor layer includes a thin portion forming a pinch area located under the channel area of the transistor and a thick portion located under the source and drain areas of the transistor, the thin portion of the buried semiconductor layer being thinner than the thick portion.

12. The image sensor pixel of claim 11, wherein the pinch area is located in an upper portion of the buried semiconductor layer.

13. The image sensor pixel of claim 11, wherein an insulating area in an upper portion of the substrate surrounds the source and drain areas and the channel area of the transistor, the thick portion of the buried semiconductor layer surrounding the pinch area and extending under the insulating area.

14. The image sensor pixel of claim 11, wherein a tank area of the first conductivity type, but more heavily doped than the substrate, is located at a level of the channel area.

15. The image sensor pixel of claim 11, wherein the transistor includes an insulated gate, the source and drain areas being placed on either side of the gate in an upper portion of the substrate, a surface portion of the substrate between the source and drain areas under the gate forming the channel area.

16. An image sensor comprising a plurality of pixels, each of said pixels comprising:
an MOS transistor formed in a semiconductor substrate of a first conductivity type, the MOS transistor including source and drain areas, a channel area and an insulated gate above the channel area; and
a buried semiconductor layer of a second conductivity type located in the substrate under the MOS transistor and separated therefrom by a substrate portion forming a well, wherein the buried semiconductor layer includes a thin portion forming a pinch region located under the channel area of the transistor and a thick portion under the source and drain areas of the transistor, the thin portion of the buried semiconductor layer being thinner than the thick portion.

17. The image sensor of claim 16, wherein each pixel includes an insulating area located in an upper portion of the substrate and surrounding the source and drain areas and the channel area of the transistor, the thick portion of the buried semiconductor layer surrounding the pinch area and extending under the insulating area, and wherein the insulating areas of the pixels separate the transistors of the pixels from one another, the depth of the insulating areas being smaller than that of the wells of the pixels.

18. A method for forming an image sensor pixel, comprising:
forming, in a semiconductor substrate of a first conductivity type, an insulating area surrounding an active area in an upper portion of the substrate;
forming, in the semiconductor substrate, a buried semiconductor layer of a second conductivity type;
forming a deep buried semiconductor pocket of the first conductivity type by ion implantation in a lower portion of the buried semiconductor layer, wherein the thickness of the buried semiconductor layer is decreased above the buried semiconductor pocket;
forming an insulated gate of a transistor above a central strip of the active area, which forms a channel area; and
forming source and drain areas of the second conductivity type in the active area, on either side of the insulated gate, wherein the buried semiconductor pocket is located below the channel area of the transistor, the buried layer including a thin portion under the channel area and a thick portion under all or part of the source and drain areas, the thin portion of the buried layer being thinner than the thick portion.

* * * * *